United States Patent
Choi et al.

(10) Patent No.: US 9,252,094 B2
(45) Date of Patent: Feb. 2, 2016

(54) SEMICONDUCTOR DEVICE AND METHOD OF FORMING AN INTERCONNECT STRUCTURE WITH CONDUCTIVE MATERIAL RECESSED WITHIN CONDUCTIVE RING OVER SURFACE OF CONDUCTIVE PILLAR

(75) Inventors: DaeSik Choi, Seoul (KR); Sang Mi Park, Kyounggi-do (KR)

(73) Assignee: STATS ChipPAC, Ltd., Singapore (SG)

(*) Notice: Subject to any disclaimer, the term of this patent is extended or adjusted under 35 U.S.C. 154(b) by 41 days.

(21) Appl. No.: 13/098,448

(22) Filed: Apr. 30, 2011

(65) Prior Publication Data
US 2012/0273938 A1    Nov. 1, 2012

(51) Int. Cl.
*H01L 21/76*  (2006.01)
*H01L 23/498*  (2006.01)
(Continued)

(52) U.S. Cl.
CPC ...... *H01L 23/49816* (2013.01); *H01L 21/4853* (2013.01); *H01L 24/13* (2013.01); *H01L 23/3192* (2013.01); *H01L 24/03* (2013.01); *H01L 24/05* (2013.01); *H01L 24/11* (2013.01); *H01L 24/81* (2013.01); *H01L 24/94* (2013.01); *H01L 2224/0332* (2013.01); *H01L 2224/0345* (2013.01); *H01L 2224/0347* (2013.01); *H01L 2224/0361* (2013.01); *H01L 2224/03452* (2013.01); *H01L 2224/03462* (2013.01); *H01L 2224/03464* (2013.01); *H01L 2224/03474* (2013.01); *H01L 2224/03912* (2013.01); *H01L 2224/0401* (2013.01); *H01L 2224/0566* (2013.01); *H01L 2224/05611* (2013.01); *H01L 2224/05624* (2013.01); *H01L 2224/05639* (2013.01); *H01L 2224/05644* (2013.01); *H01L 2224/05647* (2013.01); *H01L 2224/05655* (2013.01); *H01L 2224/05666* (2013.01); *H01L 2224/05671* (2013.01); *H01L 2224/10145* (2013.01); *H01L 2224/1132* (2013.01); *H01L 2224/1133* (2013.01); *H01L 2224/1145* (2013.01); *H01L 2224/11334* (2013.01); *H01L 2224/11452* (2013.01); *H01L 2224/11462* (2013.01); *H01L 2224/11464* (2013.01);
(Continued)

(58) Field of Classification Search
USPC .......................................... 257/737; 438/614
See application file for complete search history.

(56) References Cited

U.S. PATENT DOCUMENTS 5,075,965 A   12/1991   Carey et al.
5,136,363 A   8/1992   Endo et al.
(Continued)

*Primary Examiner* — Thao X Le
*Assistant Examiner* — Laura Dykes
(74) *Attorney, Agent, or Firm* — Robert D. Atkins; Patent Law Group: Atkins and Associates, P.C.

(57) ABSTRACT

A semiconductor device has a semiconductor die with a first conductive layer formed over an active surface of the semiconductor die. An insulation layer is formed over the active surface of the semiconductor die. A second conductive layer is conformally applied over the insulating layer and first conductive layer. Conductive pillars are formed over the first conductive layer. Conductive rings are formed around a perimeter of the conductive pillars. A conductive material is deposited over the surface of the conductive pillars within the conductive rings. A substrate has a third conductive layer formed over a surface of the substrate. The semiconductor die is mounted to a substrate with the third conductive layer electrically connected to the conductive material within the conductive rings. The conductive rings inhibit outward flow of the conductive material from under the conductive pillars to prevent electrical bridging between adjacent conductive pillars.

17 Claims, 14 Drawing Sheets

(51) Int. Cl.
*H01L 21/48* (2006.01)
*H01L 23/00* (2006.01)
*H01L 23/31* (2006.01)

(52) U.S. Cl.
CPC ............... *H01L2224/11849* (2013.01); *H01L 2224/11901* (2013.01); *H01L 2224/11903* (2013.01); *H01L 2224/131* (2013.01); *H01L 2224/13014* (2013.01); *H01L 2224/13016* (2013.01); *H01L 2224/13019* (2013.01); *H01L 2224/13076* (2013.01); *H01L 2224/13082* (2013.01); *H01L 2224/13111* (2013.01); *H01L 2224/13113* (2013.01); *H01L 2224/13116* (2013.01); *H01L 2224/13124* (2013.01); *H01L 2224/13139* (2013.01); *H01L 2224/13144* (2013.01); *H01L 2224/13147* (2013.01); *H01L 2224/13155* (2013.01); *H01L 2224/16237* (2013.01); *H01L 2224/81191* (2013.01); *H01L 2224/81193* (2013.01); *H01L 2224/81203* (2013.01); *H01L 2224/81411* (2013.01); *H01L 2224/81424* (2013.01); *H01L 2224/81439* (2013.01); *H01L 2224/81444* (2013.01); *H01L 2224/81447* (2013.01); *H01L 2224/81455* (2013.01); *H01L 2224/81815* (2013.01); *H01L 2224/94* (2013.01); *H01L 2924/01029* (2013.01); *H01L 2924/01322* (2013.01); *H01L 2924/12041* (2013.01); *H01L 2924/1306* (2013.01); *H01L 2924/13091* (2013.01); *H01L 2924/181* (2013.01); *H01L 2924/381* (2013.01); *H01L 2924/3841* (2013.01)

(56) References Cited

U.S. PATENT DOCUMENTS

| | | | |
|---|---|---|---|
| 5,446,635 | A | 8/1995 | Jehn |
| 5,641,990 | A | 6/1997 | Chiu |
| 5,712,192 | A * | 1/1998 | Lewis et al. .................. 438/108 |
| 5,844,314 | A * | 12/1998 | Kim .............................. 257/737 |
| 5,889,326 | A | 3/1999 | Tanaka |
| 6,013,571 | A | 1/2000 | Morrell |
| 6,228,689 | B1 * | 5/2001 | Liu ................................ 438/131 |
| 6,229,220 | B1 | 5/2001 | Saitoh et al. |
| 6,281,106 | B1 | 8/2001 | Higdon et al. |
| 6,309,959 | B1 * | 10/2001 | Wang et al. .................. 438/625 |
| 6,469,394 | B1 | 10/2002 | Wong et al. |
| 6,681,982 | B2 | 1/2004 | Tung |
| 6,784,089 | B2 | 8/2004 | Lei et al. |
| 7,208,834 | B2 | 4/2007 | Lee et al. |
| 7,382,049 | B2 | 6/2008 | Ho et al. |
| 7,804,173 | B2 | 9/2010 | Ke et al. |
| 2002/0089836 | A1 * | 7/2002 | Ishida et al. .................. 361/824 |
| 2010/0038777 | A1 * | 2/2010 | Farooq et al. ................ 257/737 |
| 2011/0101518 | A1 | 5/2011 | Cho et al. |
| 2012/0012997 | A1 * | 1/2012 | Shen et al. .................... 257/737 |
| 2012/0217640 | A1 | 8/2012 | Choi et al. |

* cited by examiner

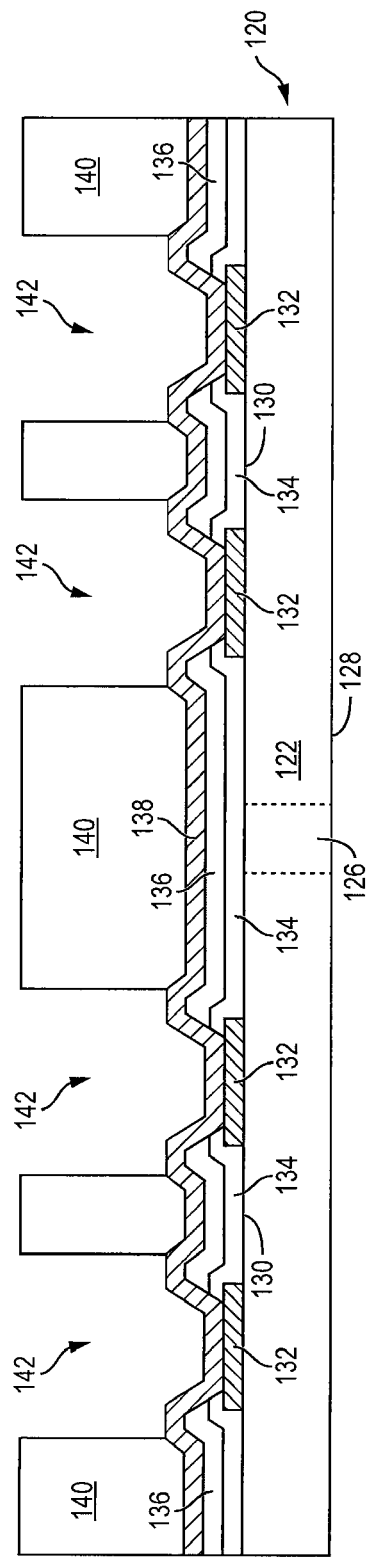
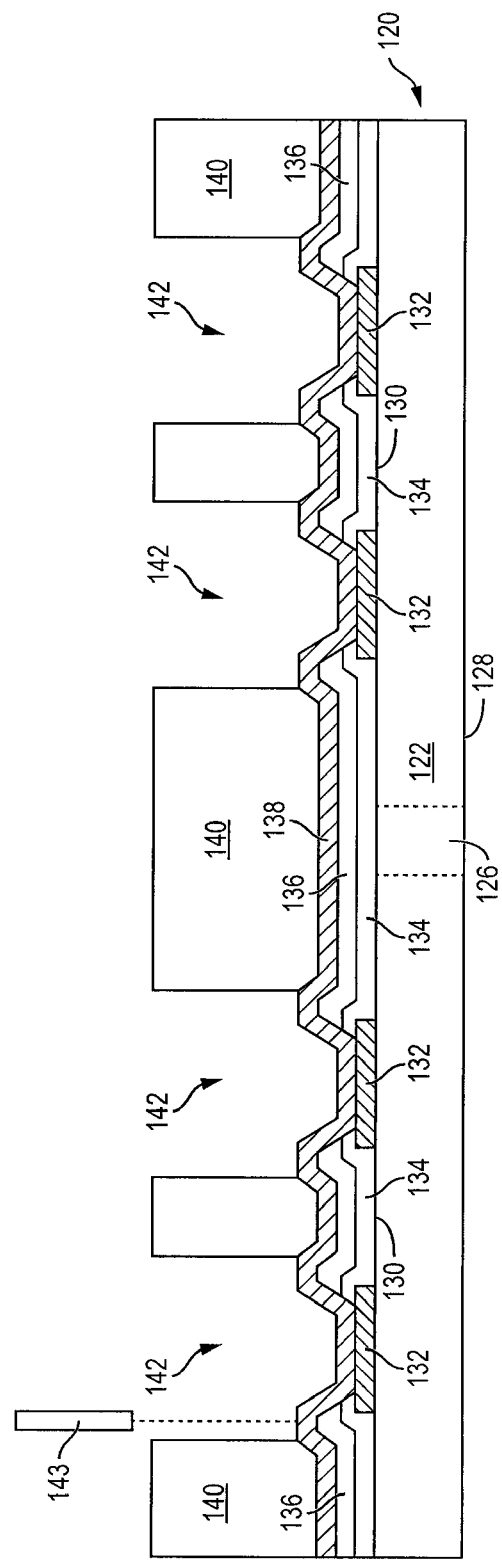

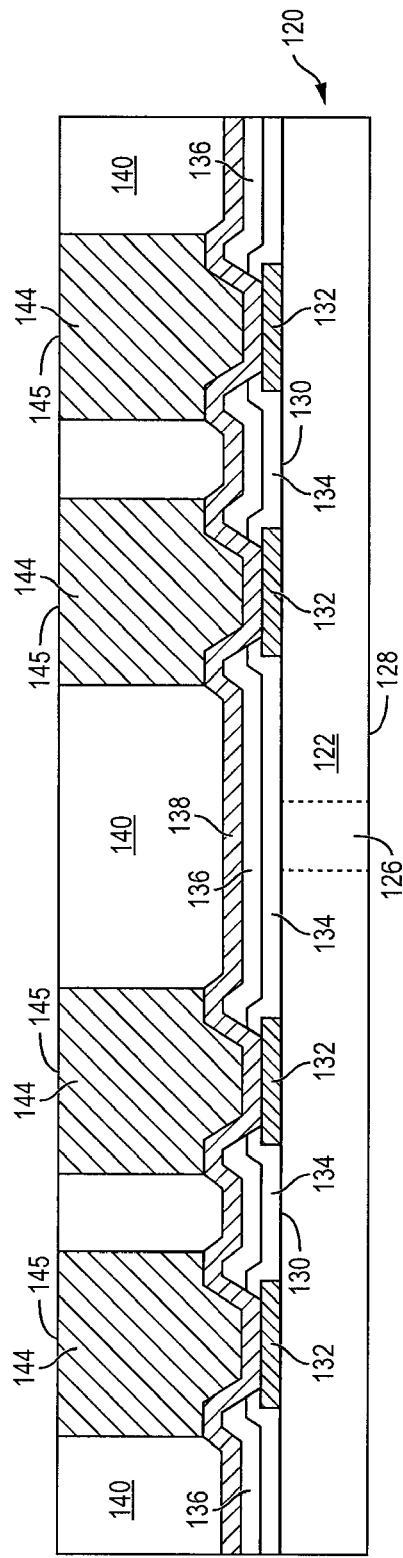
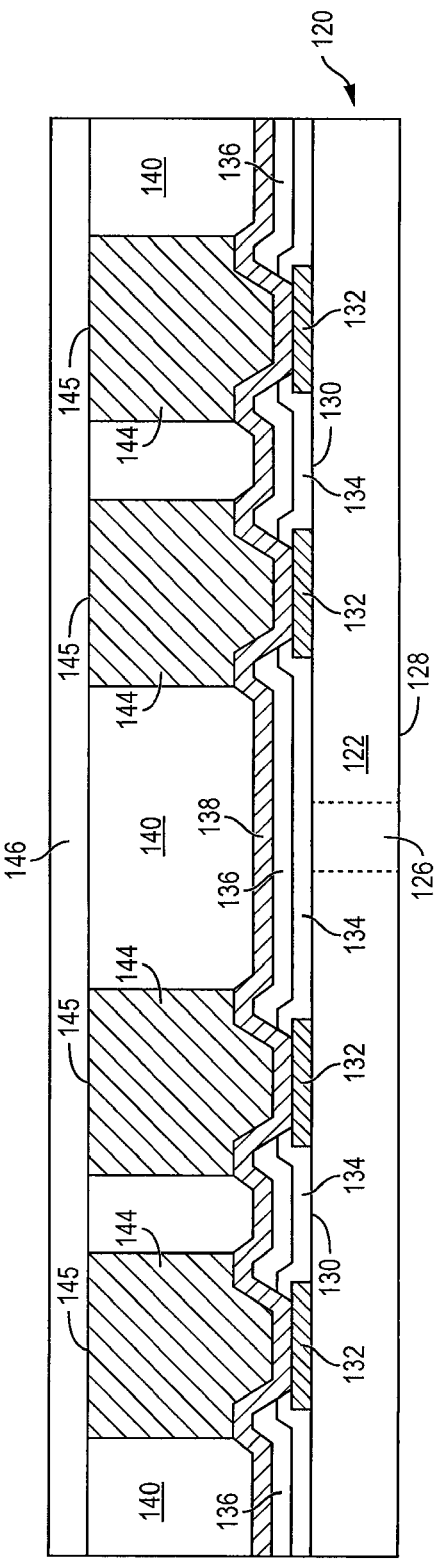

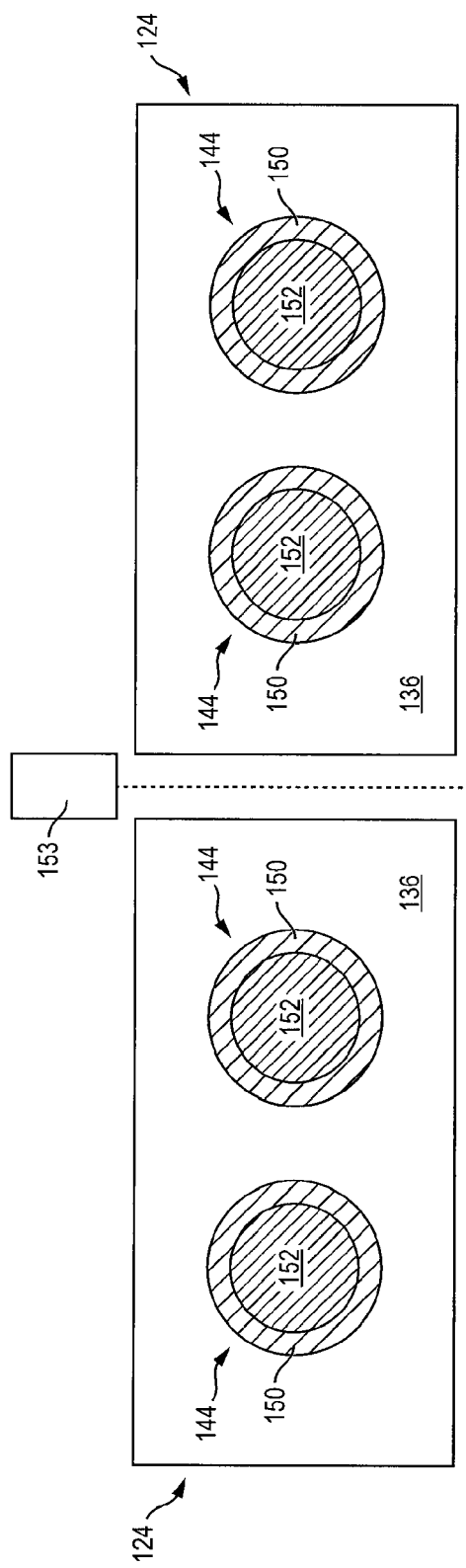
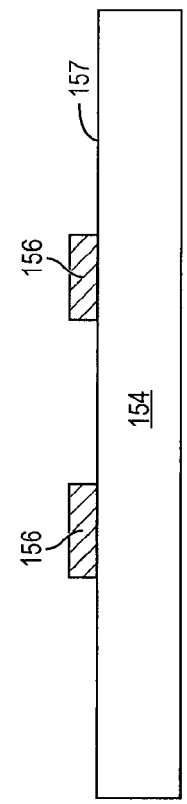
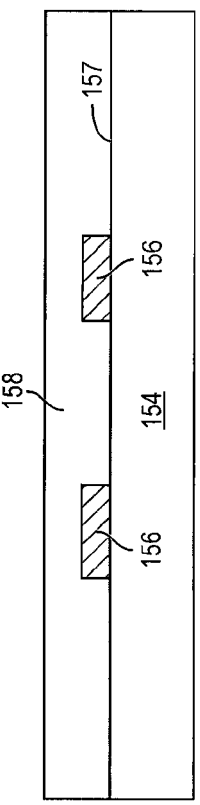
FIG. 3r
FIG. 4a
FIG. 4b

SEMICONDUCTOR DEVICE AND METHOD OF FORMING AN INTERCONNECT STRUCTURE WITH CONDUCTIVE MATERIAL RECESSED WITHIN CONDUCTIVE RING OVER SURFACE OF CONDUCTIVE PILLAR

FIELD OF THE INVENTION

The present invention relates in general to semiconductor devices and, more particularly, to a semiconductor device and method of forming an interconnect structure with conductive material recessed within a conductive ring over a surface of a conductive pillar.

BACKGROUND OF THE INVENTION

Semiconductor devices are commonly found in modern electronic products. Semiconductor devices vary in the number and density of electrical components. Discrete semiconductor devices generally contain one type of electrical component, e.g., light emitting diode (LED), small signal transistor, resistor, capacitor, inductor, and power metal oxide semiconductor field effect transistor (MOSFET). Integrated semiconductor devices typically contain hundreds to millions of electrical components. Examples of integrated semiconductor devices include microcontrollers, microprocessors, charged-coupled devices (CCDs), solar cells, and digital micro-mirror devices (DMDs).

Semiconductor devices perform a wide range of functions such as signal processing, high-speed calculations, transmitting and receiving electromagnetic signals, controlling electronic devices, transforming sunlight to electricity, and creating visual projections for television displays. Semiconductor devices are found in the fields of entertainment, communications, power conversion, networks, computers, and consumer products. Semiconductor devices are also found in military applications, aviation, automotive, industrial controllers, and office equipment.

Semiconductor devices exploit the electrical properties of semiconductor materials. The atomic structure of semiconductor material allows its electrical conductivity to be manipulated by the application of an electric field or base current or through the process of doping. Doping introduces impurities into the semiconductor material to manipulate and control the conductivity of the semiconductor device.

A semiconductor device contains active and passive electrical structures. Active structures, including bipolar and field effect transistors, control the flow of electrical current. By varying levels of doping and application of an electric field or base current, the transistor either promotes or restricts the flow of electrical current. Passive structures, including resistors, capacitors, and inductors, create a relationship between voltage and current necessary to perform a variety of electrical functions. The passive and active structures are electrically connected to form circuits, which enable the semiconductor device to perform high-speed calculations and other useful functions.

Semiconductor devices are generally manufactured using two complex manufacturing processes, i.e., front-end manufacturing, and back-end manufacturing, each involving potentially hundreds of steps. Front-end manufacturing involves the formation of a plurality of die on the surface of a semiconductor wafer. Each die is typically identical and contains circuits formed by electrically connecting active and passive components. The term "semiconductor die" as used herein refers to both the singular and plural form of the word, and accordingly can refer to both a single semiconductor device and multiple semiconductor devices. Back-end manufacturing involves singulating individual die from the finished wafer and packaging the die to provide structural support and environmental isolation.

One goal of semiconductor manufacturing is to produce smaller semiconductor devices. Smaller devices typically consume less power, have higher performance, and can be produced more efficiently. In addition, smaller semiconductor devices have a smaller footprint, which is desirable for smaller end products. A smaller die size can be achieved by improvements in the front-end process resulting in die with smaller, higher density active and passive components. Back-end processes may result in semiconductor device packages with a smaller footprint by improvements in electrical interconnection and packaging materials.

Semiconductor die are commonly mounted to a substrate or PCB. A solder cap can be formed over a top surface of conductive posts attached to the semiconductor die. The solder cap on the conductive pillars bonds with bump material on the substrate by reflow. Alternatively, the solder cap on the conductive pillars is bonded to the substrate without bump material, or the conductive pillars without solder cap are bonded with bump material on the substrate. The temperature and pressure of the reflow process can cause excess solder cap and/or bump material to flow outward and contact adjacent conductive pillars, which creates electrical bridging defects. A larger spacing or pitch can be allocated between conductive pillars to allow for the outward flow of excess solder cap and bump material without causing electrical bridging defects. However, the increase in pitch decreases interconnect density.

SUMMARY OF THE INVENTION

A need exists to reduce electrical bridging defects while maintaining a fine interconnect pitch. Accordingly, in one embodiment, the present invention is a method of making a semiconductor device comprising the steps of providing a semiconductor die with a first conductive layer formed over an active surface of the semiconductor die, forming a first insulation layer over the active surface of the semiconductor die, conformally applying a second conductive layer over the first insulating layer and first conductive layer, forming a second insulation layer over the second conductive layer, forming a plurality of conductive pillars within the second insulating layer, forming a third insulation layer over the second insulating layer and conductive pillars, forming a plurality of conductive rings within the third insulating layer around a perimeter of a surface of the conductive pillars, removing the third insulating layer over the surface of the conductive pillars within the conductive rings, depositing a conductive material over the surface of the conductive pillars within the conductive rings, and removing remaining portions of the second and third insulating layers.

In another embodiment, the present invention is a method of making a semiconductor device comprising the steps of providing a semiconductor die with a first conductive layer formed over a surface of the semiconductor die, forming a first insulation layer over the surface of the semiconductor die, forming a second conductive layer over the first insulating layer and first conductive layer, forming a plurality of conductive pillars over the second conductive layer, forming a plurality of conductive rings around a perimeter of a surface of the conductive pillars, and depositing a first conductive material over the surface of the conductive pillars within the conductive rings.

In another embodiment, the present invention is a method of making a semiconductor device comprising the steps of providing a semiconductor die with a first conductive layer formed over a surface of the semiconductor die, and forming a plurality of conductive pillars over the first conductive layer. The conductive pillars include a conductive ring around a perimeter of a surface of the conductive pillars. The method further includes the step of depositing a first conductive material over the surface of the conductive pillars within the conductive ring.

In another embodiment, the present invention is a semiconductor device comprising a semiconductor die having a first conductive layer formed over a surface of the semiconductor die. A plurality of conductive pillars is formed over the first conductive layer. The conductive pillars include a conductive ring around a perimeter of a surface of the conductive pillars. A first conductive material is deposited over the surface of the conductive pillars within the conductive ring.

BRIEF DESCRIPTION OF THE DRAWINGS

FIGS. 4a-4e illustrate another process of forming a substrate with openings over a conductive layer;

DETAILED DESCRIPTION OF THE DRAWINGS

Figure 1:
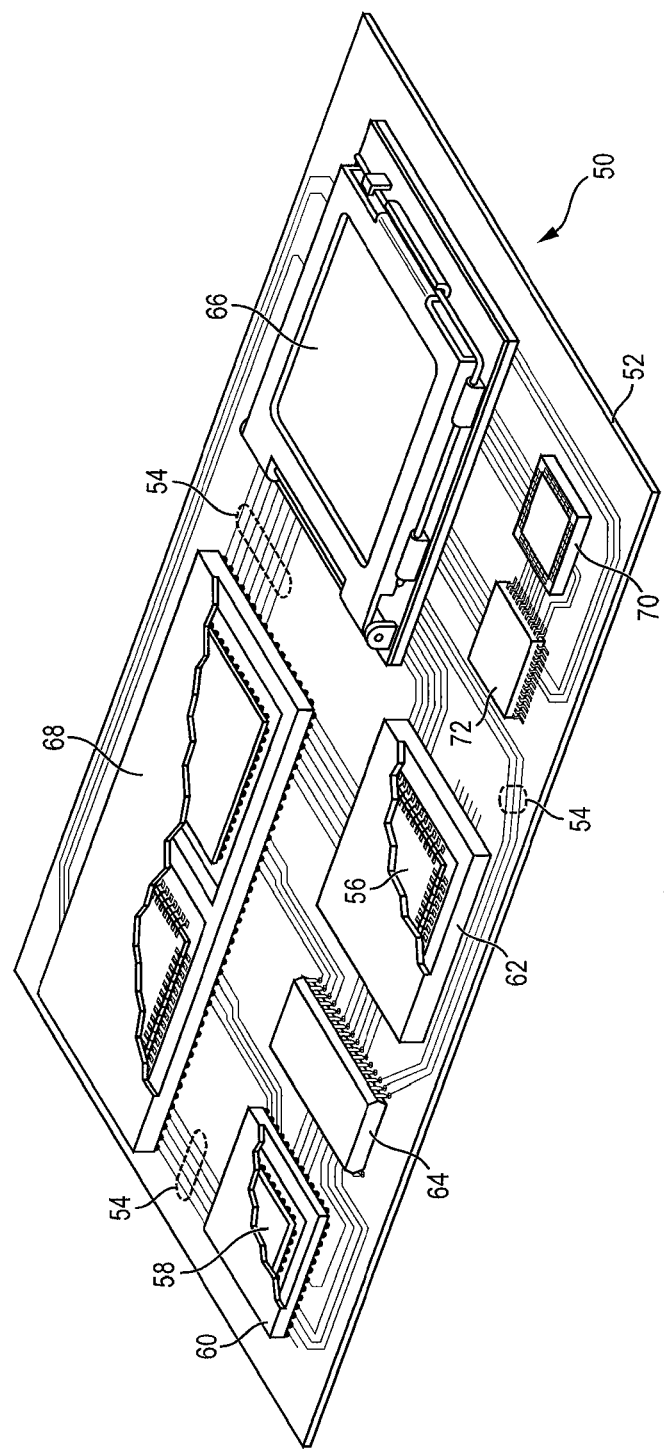
FIG. 1 illustrates a printed circuit board (PCB) with different types of packages mounted to its surface.

The present invention is described in one or more embodiments in the following description with reference to the figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings.

Semiconductor devices are generally manufactured using two complex manufacturing processes: front-end manufacturing and back-end manufacturing. Front-end manufacturing involves the formation of a plurality of die on the surface of a semiconductor wafer. Each die on the wafer contains active and passive electrical components, which are electrically connected to form functional electrical circuits. Active electrical components, such as transistors and diodes, have the ability to control the flow of electrical current. Passive electrical components, such as capacitors, inductors, resistors, and transformers, create a relationship between voltage and current necessary to perform electrical circuit functions.

Passive and active components are formed over the surface of the semiconductor wafer by a series of process steps including doping, deposition, photolithography, etching, and planarization. Doping introduces impurities into the semiconductor material by techniques such as ion implantation or thermal diffusion. The doping process modifies the electrical conductivity of semiconductor material in active devices, transforming the semiconductor material into an insulator, conductor, or dynamically changing the semiconductor material conductivity in response to an electric field or base current. Transistors contain regions of varying types and degrees of doping arranged as necessary to enable the transistor to promote or restrict the flow of electrical current upon the application of the electric field or base current.

Active and passive components are formed by layers of materials with different electrical properties. The layers can be formed by a variety of deposition techniques determined in part by the type of material being deposited. For example, thin film deposition can involve chemical vapor deposition (CVD), physical vapor deposition (PVD), electrolytic plating, and electroless plating processes. Each layer is generally patterned to form portions of active components, passive components, or electrical connections between components.

The layers can be patterned using photolithography, which involves the deposition of light sensitive material, e.g., photoresist, over the layer to be patterned. A pattern is transferred from a photomask to the photoresist using light. In one embodiment, the portion of the photoresist pattern subjected to light is removed using a solvent, exposing portions of the underlying layer to be patterned. In another embodiment, the portion of the photoresist pattern not subjected to light, the negative photoresist, is removed using a solvent, exposing portions of the underlying layer to be patterned. The remainder of the photoresist is removed, leaving behind a patterned layer. Alternatively, some types of materials are patterned by directly depositing the material into the areas or voids formed by a previous deposition/etch process using techniques such as electroless and electrolytic plating.

Depositing a thin film of material over an existing pattern can exaggerate the underlying pattern and create a non-uniformly flat surface. A uniformly flat surface is required to produce smaller and more densely packed active and passive components. Planarization can be used to remove material from the surface of the wafer and produce a uniformly flat surface. Planarization involves polishing the surface of the wafer with a polishing pad. An abrasive material and corrosive chemical are added to the surface of the wafer during polishing. The combined mechanical action of the abrasive and corrosive action of the chemical removes any irregular topography, resulting in a uniformly flat surface.

Back-end manufacturing refers to cutting or singulating the finished wafer into the individual die and then packaging the die for structural support and environmental isolation. To singulate the die, the wafer is scored and broken along non-functional regions of the wafer called saw streets or scribes. The wafer is singulated using a laser cutting tool or saw blade. After singulation, the individual die are mounted to a package substrate that includes pins or contact pads for interconnection with other system components. Contact pads formed over the semiconductor die are then connected to contact pads within the package. The electrical connections can be made with solder bumps, stud bumps, conductive paste, or wirebonds. An encapsulant or other molding material is deposited over the package to provide physical support and electrical isolation. The finished package is then inserted into an electrical system and the functionality of the semiconductor device is made available to the other system components.

FIG. 1 illustrates electronic device 50 having a chip carrier substrate or printed circuit board (PCB) 52 with a plurality of semiconductor packages mounted on its surface. Electronic device 50 can have one type of semiconductor package, or multiple types of semiconductor packages, depending on the application. The different types of semiconductor packages are shown in FIG. 1 for purposes of illustration.

Electronic device 50 can be a stand-alone system that uses the semiconductor packages to perform one or more electrical functions. Alternatively, electronic device 50 can be a subcomponent of a larger system. For example, electronic device 50 can be part of a cellular phone, personal digital assistant (PDA), digital video camera (DVC), or other electronic communication device. Alternatively, electronic device 50 can be a graphics card, network interface card, or other signal processing card that can be inserted into a computer. The semiconductor package can include microprocessors, memories, application specific integrated circuits (ASIC), logic circuits, analog circuits, RF circuits, discrete devices, or other semiconductor die or electrical components. Miniaturization and weight reduction are essential for these products to be accepted by the market. The distance between semiconductor devices must be decreased to achieve higher density.

In FIG. 1, PCB 52 provides a general substrate for structural support and electrical interconnect of the semiconductor packages mounted on the PCB. Conductive signal traces 54 are formed over a surface or within layers of PCB 52 using evaporation, electrolytic plating, electroless plating, screen printing, or other suitable metal deposition process. Signal traces 54 provide for electrical communication between each of the semiconductor packages, mounted components, and other external system components. Traces 54 also provide power and ground connections to each of the semiconductor packages.

In some embodiments, a semiconductor device has two packaging levels. First level packaging is a technique for mechanically and electrically attaching the semiconductor die to an intermediate carrier. Second level packaging involves mechanically and electrically attaching the intermediate carrier to the PCB. In other embodiments, a semiconductor device may only have the first level packaging where the die is mechanically and electrically mounted directly to the PCB.

For the purpose of illustration, several types of first level packaging, including bond wire package 56 and flipchip 58, are shown on PCB 52. Additionally, several types of second level packaging, including ball grid array (BGA) 60, bump chip carrier (BCC) 62, dual in-line package (DIP) 64, land grid array (LGA) 66, multi-chip module (MCM) 68, quad flat non-leaded package (QFN) 70, and quad flat package 72, are shown mounted on PCB 52. Depending upon the system requirements, any combination of semiconductor packages, configured with any combination of first and second level packaging styles, as well as other electronic components, can be connected to PCB 52. In some embodiments, electronic device 50 includes a single attached semiconductor package, while other embodiments call for multiple interconnected packages. By combining one or more semiconductor packages over a single substrate, manufacturers can incorporate pre-made components into electronic devices and systems. Because the semiconductor packages include sophisticated functionality, electronic devices can be manufactured using cheaper components and a streamlined manufacturing process. The resulting devices are less likely to fail and less expensive to manufacture resulting in a lower cost for consumers.

Figure 2A:
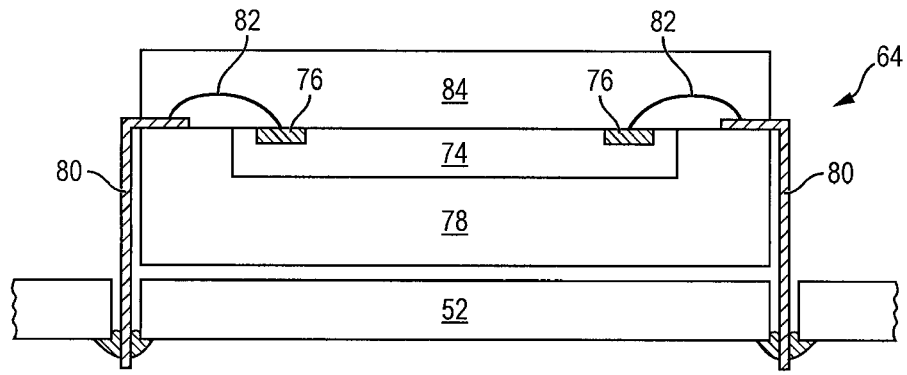
FIGS. 2a-2c illustrate further detail of the representative semiconductor packages mounted to the PCB.
Figure 2B:
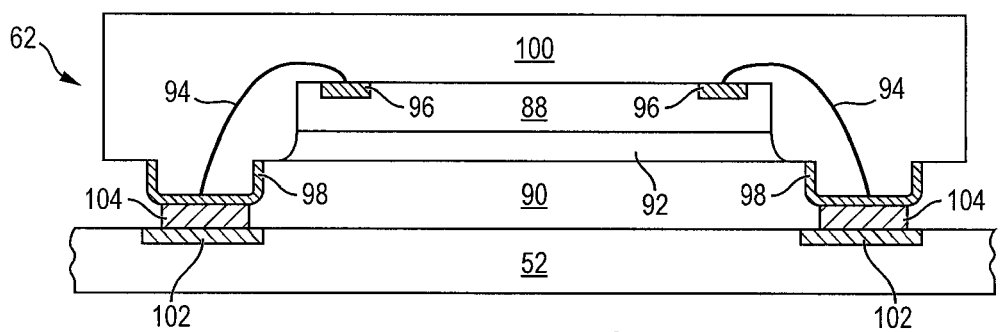
Figure 2C:
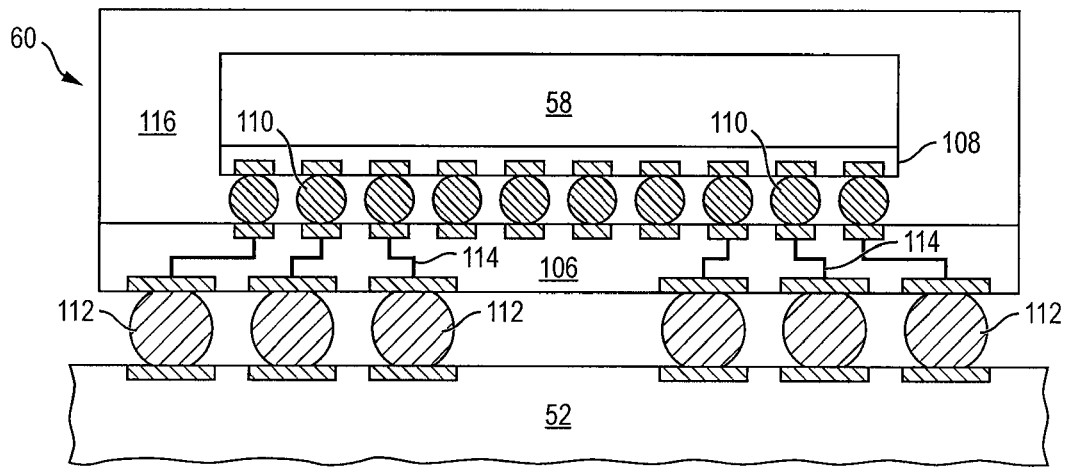

FIGS. 2a-2c show exemplary semiconductor packages. FIG. 2a illustrates further detail of DIP 64 mounted on PCB 52. Semiconductor die 74 includes an active region containing analog or digital circuits implemented as active devices, passive devices, conductive layers, and dielectric layers formed within the die and are electrically interconnected according to the electrical design of the die. For example, the circuit can include one or more transistors, diodes, inductors, capacitors, resistors, and other circuit elements formed within the active region of semiconductor die 74. Contact pads 76 are one or more layers of conductive material, such as aluminum (Al), copper (Cu), tin (Sn), nickel (Ni), gold (Au), or silver (Ag), and are electrically connected to the circuit elements formed within semiconductor die 74. During assembly of DIP 64, semiconductor die 74 is mounted to an intermediate carrier 78 using a gold-silicon eutectic layer or adhesive material such as thermal epoxy or epoxy resin. The package body includes an insulative packaging material such as polymer or ceramic. Conductor leads 80 and bond wires 82 provide electrical interconnect between semiconductor die 74 and PCB 52. Encapsulant 84 is deposited over the package for environmental protection by preventing moisture and particles from entering the package and contaminating die 74 or bond wires 82.

FIG. 2b illustrates further detail of BCC 62 mounted on PCB 52. Semiconductor die 88 is mounted over carrier 90 using an underfill or epoxy-resin adhesive material 92. Bond wires 94 provide first level packaging interconnect between contact pads 96 and 98. Molding compound or encapsulant 100 is deposited over semiconductor die 88 and bond wires 94 to provide physical support and electrical isolation for the device. Contact pads 102 are formed over a surface of PCB 52 using a suitable metal deposition process such as electrolytic plating or electroless plating to prevent oxidation. Contact pads 102 are electrically connected to one or more conductive signal traces 54 in PCB 52. Bumps 104 are formed between contact pads 98 of BCC 62 and contact pads 102 of PCB 52.

In FIG. 2c, semiconductor die 58 is mounted face down to intermediate carrier 106 with a flipchip style first level packaging. Active region 108 of semiconductor die 58 contains analog or digital circuits implemented as active devices, passive devices, conductive layers, and dielectric layers formed according to the electrical design of the die. For example, the circuit can include one or more transistors, diodes, inductors, capacitors, resistors, and other circuit elements within active region 108. Semiconductor die 58 is electrically and mechanically connected to carrier 106 through bumps 110.

BGA 60 is electrically and mechanically connected to PCB 52 with a BGA style second level packaging using bumps 112. Semiconductor die 58 is electrically connected to conductive signal traces 54 in PCB 52 through bumps 110, signal lines 114, and bumps 112. A molding compound or encapsulant 116 is deposited over semiconductor die 58 and carrier 106 to provide physical support and electrical isolation for the device. The flipchip semiconductor device provides a short electrical conduction path from the active devices on semiconductor die 58 to conduction tracks on PCB 52 in order to reduce signal propagation distance, lower capacitance, and improve overall circuit performance. In another embodiment, the semiconductor die 58 can be mechanically and electrically connected directly to PCB 52 using flipchip style first level packaging without intermediate carrier 106.

Figure 3A:
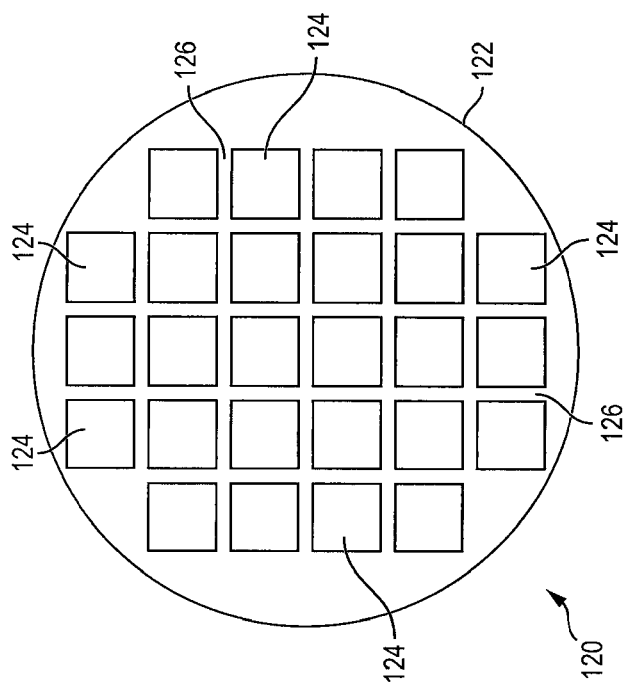
FIGS. 3a-3r illustrate a process of forming an interconnect structure with conductive material recessed within a conductive ring over a surface of a conductive pillar.

FIGS. 3a-3r illustrate, in relation to FIGS. 1 and 2a-2c, a process of forming an interconnect structure with conductive material recessed within a conductive ring over a surface of a conductive pillar. FIG. 3a shows a semiconductor wafer 120 with a base substrate material 122, such as silicon, germanium, gallium arsenide, indium phosphide, or silicon carbide, for structural support. A plurality of semiconductor die or components 124 is formed on wafer 120 separated by a non-active, inter-die wafer area or saw street 126 as described above. Saw street 126 provides cutting areas to singulate semiconductor wafer 120 into individual semiconductor die 124. In one embodiment, semiconductor die 124 may have dimensions ranging from 2×2 millimeters (mm) to 15×15 mm.

Figure 3B:
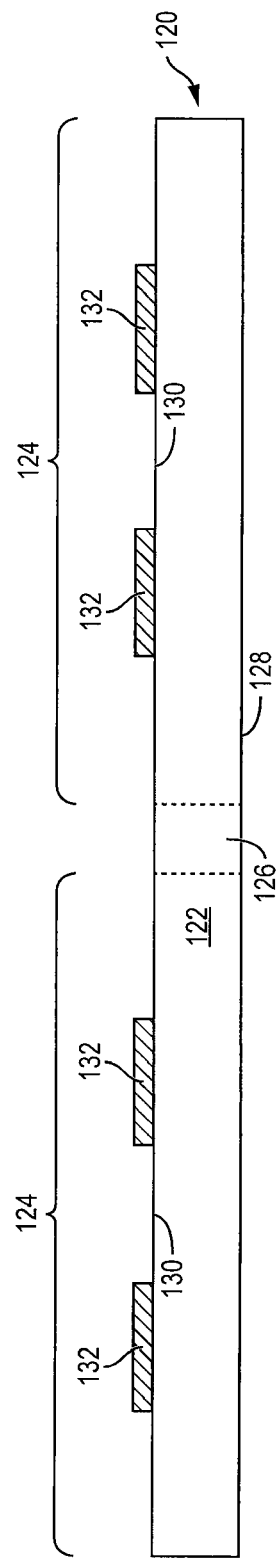

FIG. 3b shows a cross-sectional view of a portion of semiconductor wafer 120. Each semiconductor die 124 has a back surface 128 and active surface 130 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 130 to implement analog circuits or digital circuits, such as digital signal processor (DSP), ASIC, memory, or other signal processing circuit. Semiconductor die 124 may also contain integrated passive devices (IPDs), such as inductors, capacitors, and resistors, for RF signal processing. In one embodiment, semiconductor die 124 is a flipchip type die.

An electrically conductive layer 132 is formed over active surface 130 using PVD, CVD, electrolytic plating, electroless plating process, or other suitable metal deposition process. Conductive layer 132 can be one or more layers of Al, Cu, Sn, Ni, Au, Ag, or other suitable electrically conductive material. Conductive layer 132 operates as contact pads electrically connected to the circuits on active surface 130. Contact pads 132 can be disposed side-by-side a first distance from the edge of semiconductor die 124, as shown in FIG. 3b. Alternatively, contact pads 132 can be offset in multiple rows such that a first row of contact pads is disposed a first distance from the edge of the die, and a second row of contact pads alternating with the first row is disposed a second distance from the edge of the die.

Figure 3C:
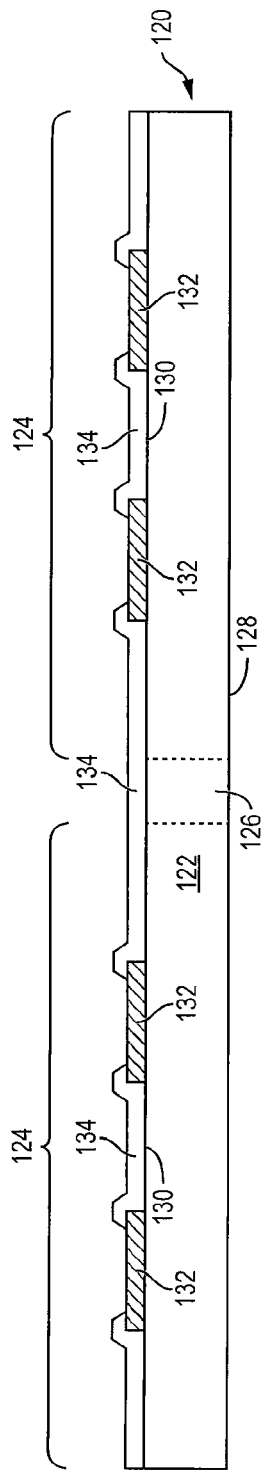

In FIG. 3c, an insulating or passivation layer 134 is formed over active surface 130 and conductive layer 132 using PVD, CVD, printing, spin coating, spray coating, sintering or thermal oxidation. The insulating layer 134 contains one or more layers of silicon dioxide (SiO2), silicon nitride (Si3N4), silicon oxynitride (SiON), tantalum pentoxide (Ta2O5), aluminum oxide (Al2O3), or other material having similar insulating and structural properties. A portion of insulating layer 134 is removed by an etching process to expose conductive layer 132.

Figure 3D:
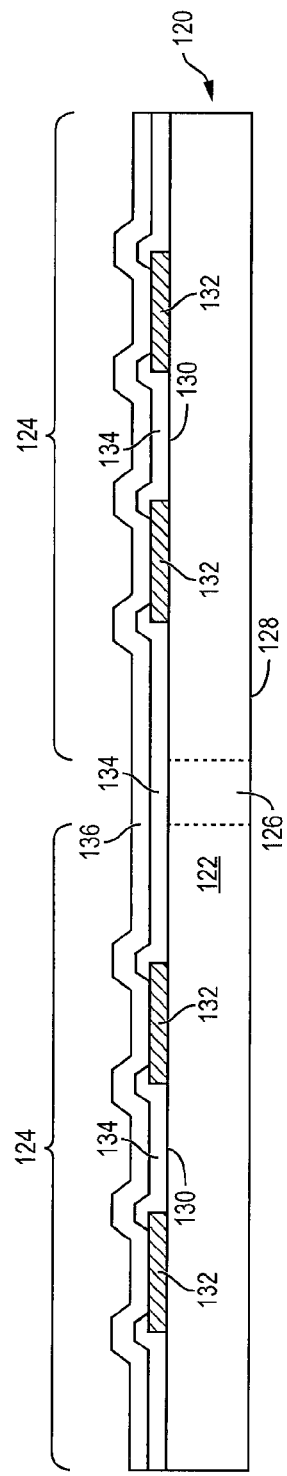
Figure 3E:
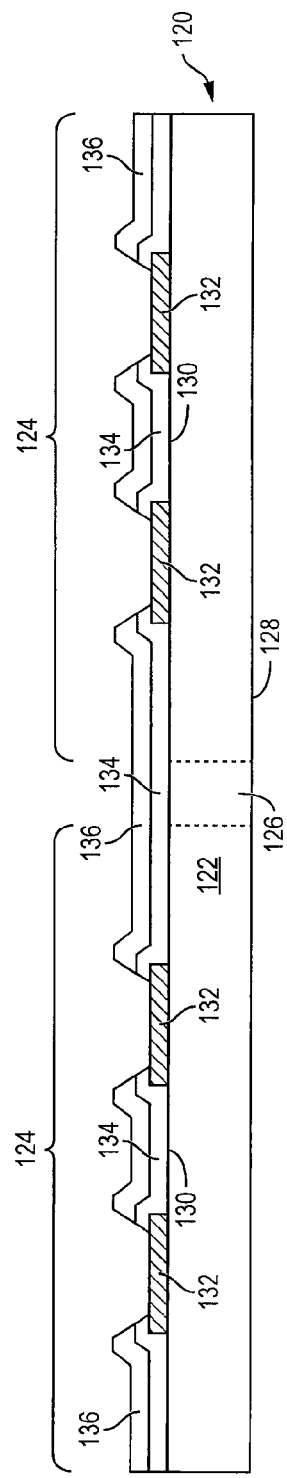

In FIG. 3d, an insulating or dielectric layer 136 is formed over insulating layer 134 and the exposed conductive layer 132 using PVD, CVD, printing, spin coating, spray coating, sintering or thermal oxidation. The insulating layer 136 contains one or more layers of SiO2, Si3N4, SiON, Ta2O5, Al2O3, benzocyclobutene (BCB), polyimide (PI), polybenzoxazoles (PBO), or other suitable dielectric material. A portion of insulating layer 136 is removed by an etching process to expose conductive layer 132, as shown in FIG. 3e.

Figure 3F:
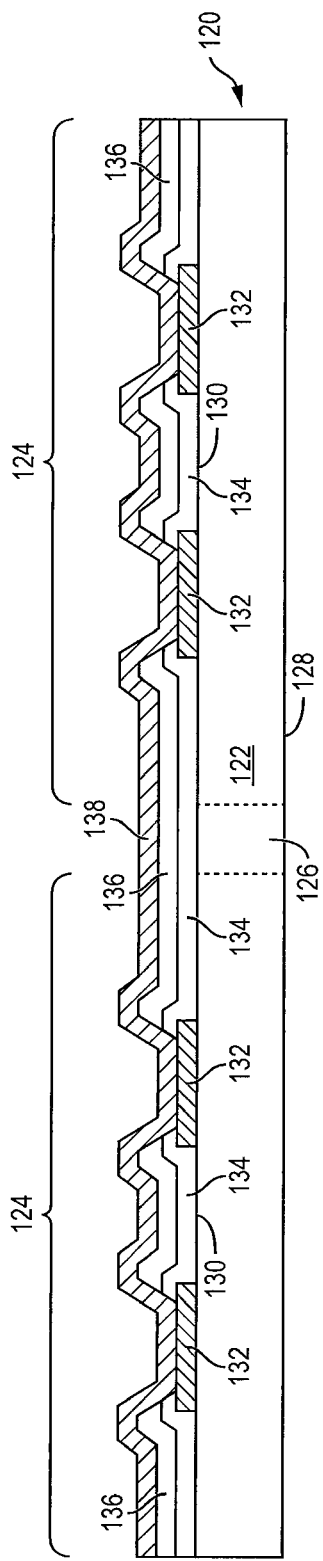

In FIG. 3f, an electrically conductive layer 138 is conformally applied over the exposed conductive layer 132 and insulating layers 134 and 136 using a patterning and metal deposition process such as printing, PVD, CVD, sputtering, electrolytic plating, and electroless plating. In one embodiment, conductive layer 138 is Ti, titanium tungsten (TiW), or chromium (Cr) formed by sputtering. Alternatively, conductive layer 138 can be one or more layers of Al, Cu, Sn, Ni, Au, Ag, or other suitable electrically conductive material. Conductive layer 138 follows the contour of insulation layer 136 and conductive layer 132. Conductive layer 138 operates as an under bump metallization (UBM) layer for a later-formed bump structure. Conductive layer 138 is electrically connected to conductive layer 132.

Figure 3G:
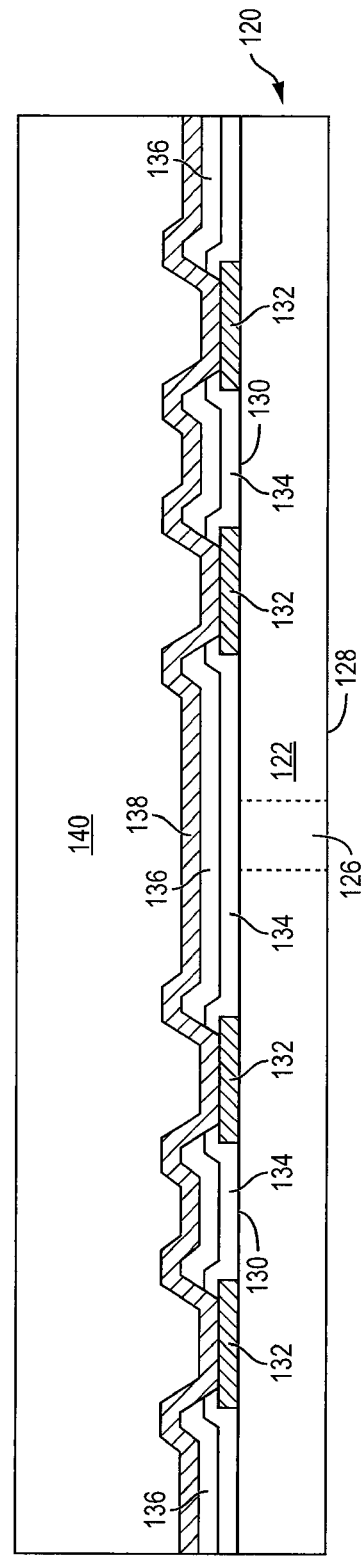

In FIG. 3g, an insulating layer 140 is formed over conductive layer 138 using PVD, CVD, printing, spin coating, spray coating, sintering or thermal oxidation. The insulating layer 140 can contain one or more layers of SiO2, Si3N4, SiON, Ta2O5, Al2O3, BCB, PI, PBO, solder resist or other photo-sensitive material. In one embodiment, insulating layer 140 has a thickness of 30-50 micrometers (μm). A top surface of insulating layer 140 is substantially flat. A portion of insulating layer 140 is removed by patterning, exposure to ultraviolet (UV) light, and developing to form circular openings 142 and expose conductive layer 138, as shown in FIG. 3h. In another example, the solder resist can include a DFR material with a PET support film. The DFR is laminated, undergoes an edge rinse, is aligned over conductive layer 132, the PET support film is removed, and the DFR material is then developed. The DFR can be irradiated using a visible light laser to form a desired pattern. The irradiated DFR material is then subjected to a developer which selectively dissolves non-irradiated portions of the photoresist material and leaves the irradiated portions of the photoresist material intact. In one embodiment, the size of openings 142 can be in the range of 40-60 micrometers (μm) or 80-100 μm.

Alternatively, circular openings 142 can be formed by laser direct ablation (LDA) using laser 143 to remove a portion of insulating layer 140 and expose conductive layer 138 in applications requiring finer interconnect dimensions, as shown in FIG. 3i.

In FIG. 3j, an electrically conductive material is deposited into circular openings 142 using a patterning and metal deposition process such as PVD, CVD, sputtering, electrolytic plating, and electroless plating. The conductive material can be Al, Cu, Sn, Ni, Au, or Ag. The conductive material forms conductive pillars or posts 144 having a top surface 145. Conductive pillars 144 are electrically connected to conductive layer 138.

Figure 3L:
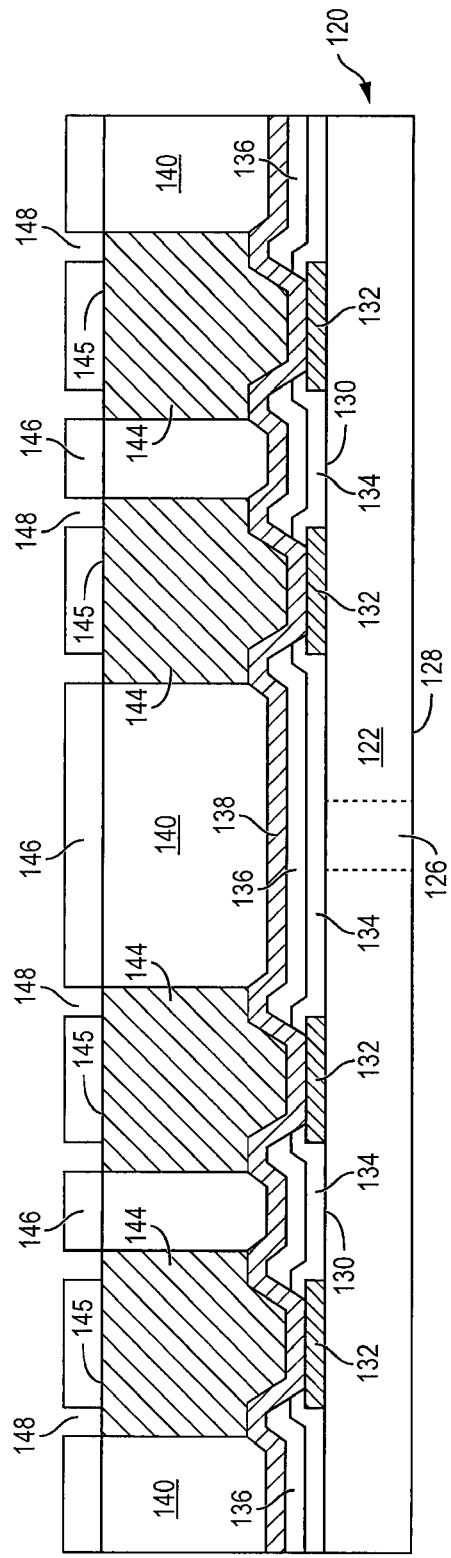

In FIG. 3k, an insulating layer 146 is formed over insulating layer 140 and conductive pillars 144 using PVD, CVD, printing, spin coating, spray coating, sintering or thermal oxidation. The insulating layer 146 can contain one or more layers of SiO2, Si3N4, SiON, Ta2O5, Al2O3, BCB, PI, PBO, solder resist or other photo-sensitive material. In one embodiment, insulating layer 146 has a thickness of 20-40 μm. A top surface of insulating layer 146 is substantially flat. A portion of insulating layer 146 is removed by patterning, exposure to UV light, and developing to form ring-shaped openings 148 and expose a perimeter area of conductive pillars 144, as shown in FIG. 3l.

Figure 3M:
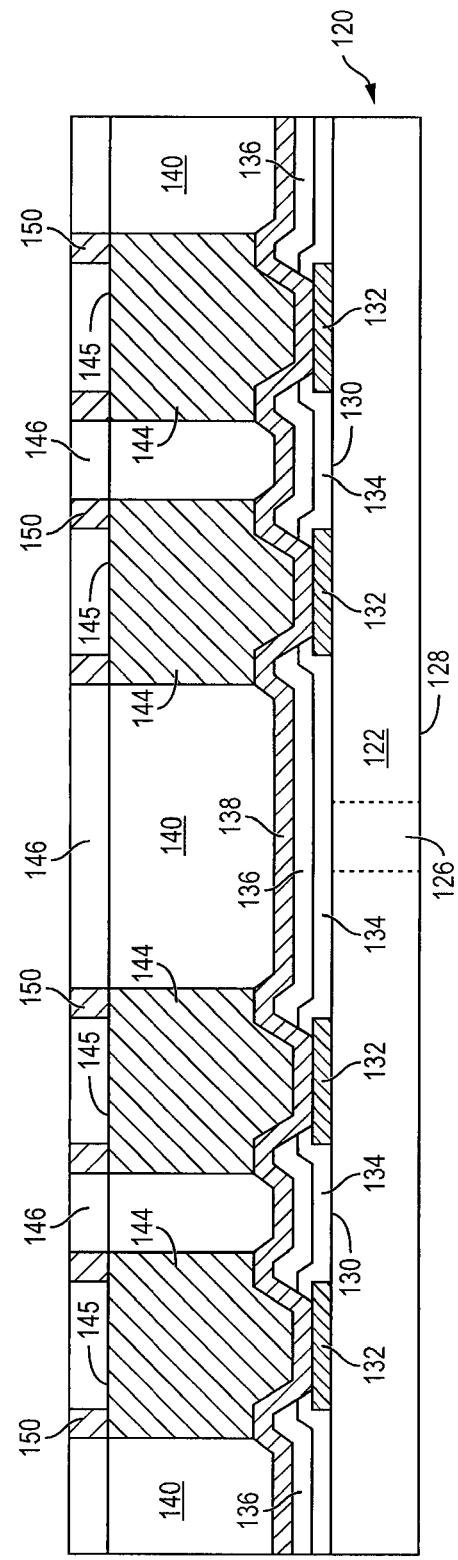

In FIG. 3m, an electrically conductive material is deposited into ring-shaped openings 148 using a patterning and metal deposition process such as PVD, CVD, sputtering, electrolytic plating, and electroless plating. The conductive material can be Al, Cu, Sn, Ni, Au, or Ag. The conductive material forms conductive rings 150 around a perimeter of top surface 145 of conductive pillars 144 electrically connected to the conductive pillars.

Figure 3N:
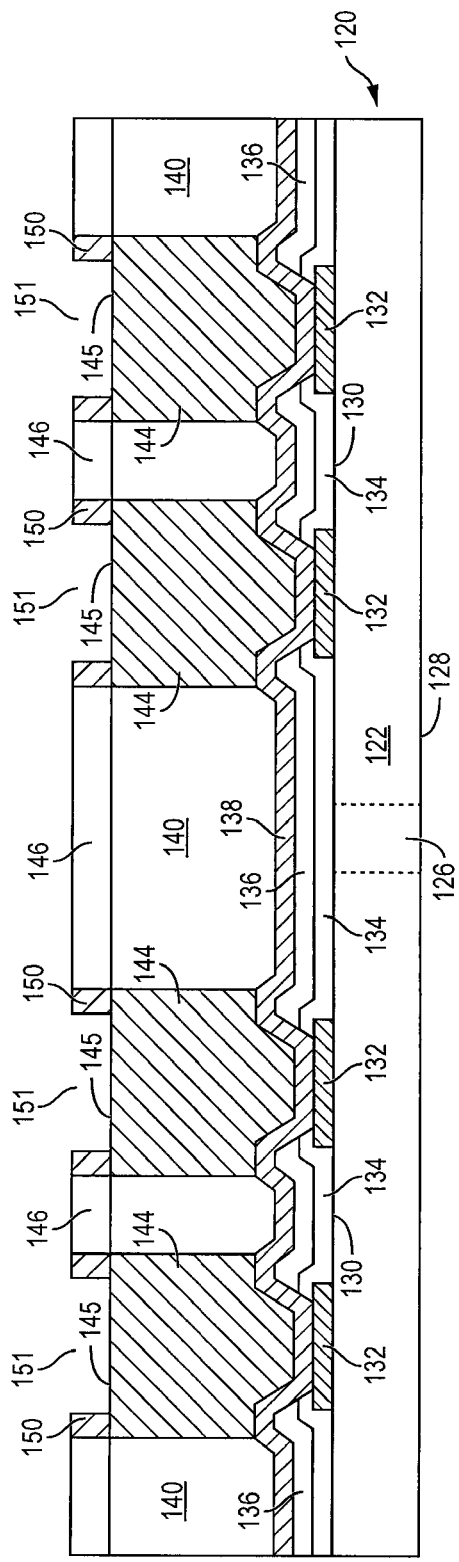
Figure 3O:
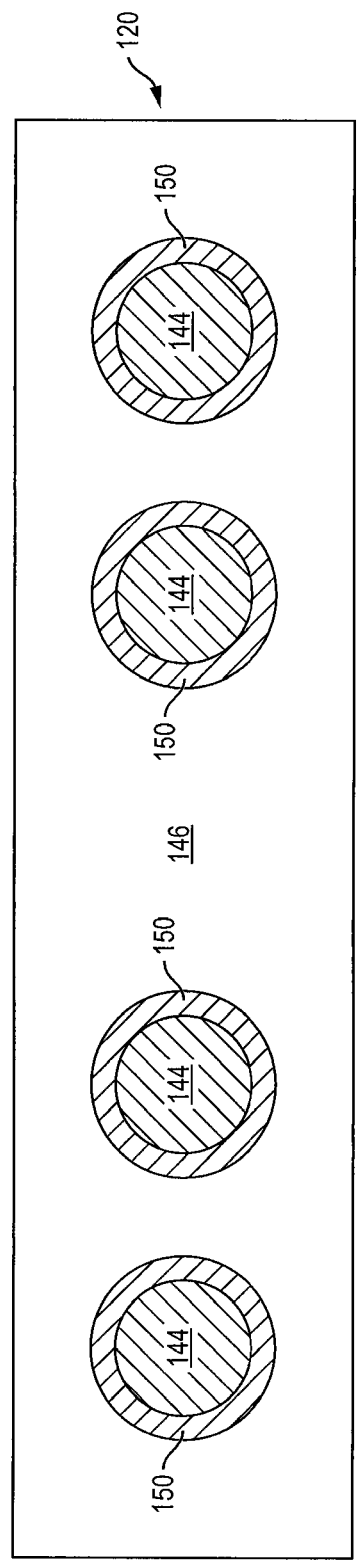

In FIG. 3n, a portion of insulating layer 146 within conductive ring 150 is removed by an etching process to form circular openings 151 and expose a top surface 145 of conductive pillars 144. After removal of insulating layer 146 within conductive ring 150, the exposed top surface 145 of conductive pillars 144 is recessed in circular openings 151 with respect to the conductive ring. FIG. 3o shows a top view of conductive rings 50 formed around the perimeter area of conductive pillars 144.

In another embodiment, an inner portion of top surface 145 of conductive pillars 144 in FIG. 3j is removed by an etching process to form circular openings 151 as shown in FIG. 3n. The conductive ring around the perimeter of conductive pillars 144 is the remaining portion of top surface 145 of the conductive pillar after the etching process.

Figure 3P:
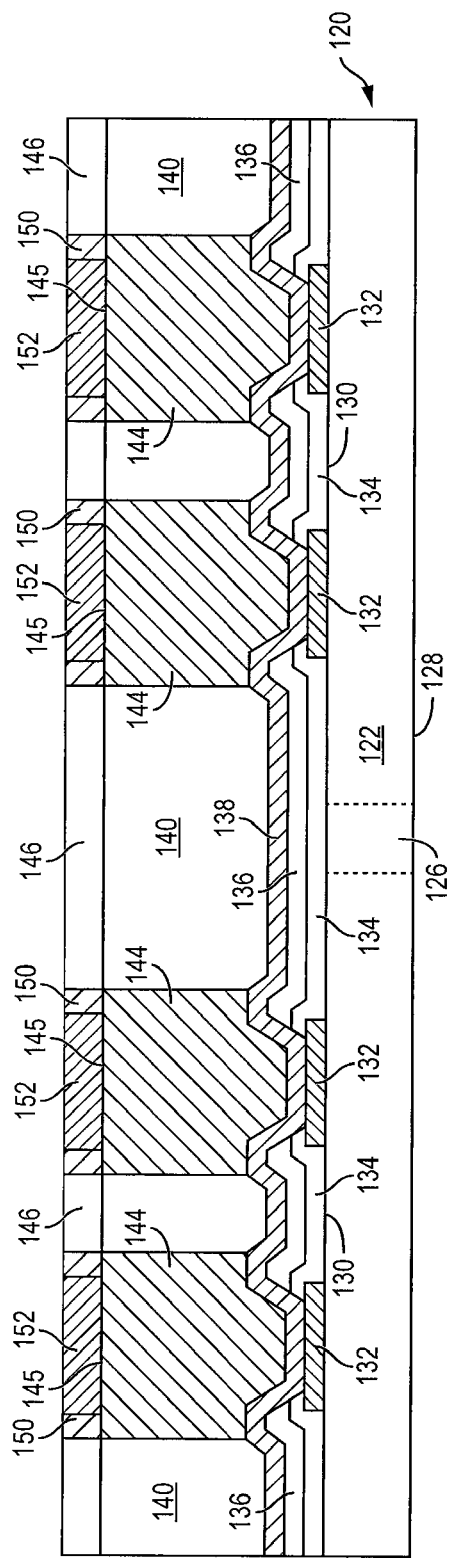

In FIG. 3p, an electrically conductive material 152 is deposited in circular openings 151 over the recessed top surface 145 of conductive pillars 144 within conductive ring 150 using a patterning and metal deposition process such as PVD, CVD, sputtering, electrolytic plating, and electroless plating. Conductive material 152 can be Al, Cu, Sn, Ni, Au, or Ag. Conductive material 152 is electrically connected to conductive pillars 144 and conductive ring 150. In one embodiment, conductive material 152 is a solder cap for enhanced wettability.

Figure 3Q:
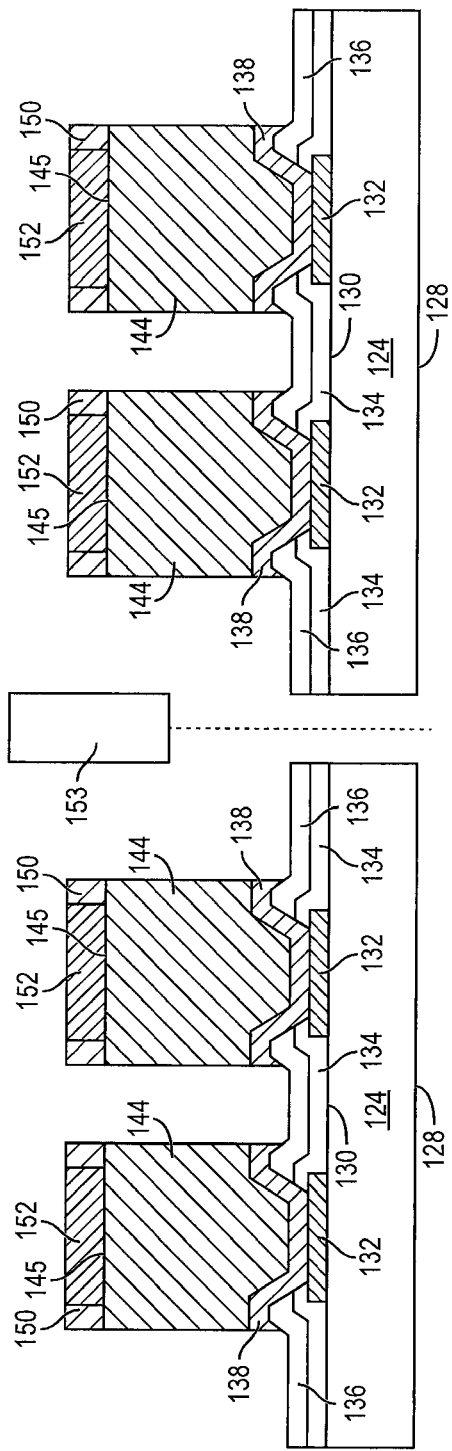

In FIG. 3q, the remaining portions of insulating layer 140 and 146 are removed leaving conductive pillars 144 with conductive ring 150 formed over top surface 145 of the conductive pillars and conductive material 152 disposed within conductive ring 150 over top surface 145 of the conductive pillars. In addition, a portion of conductive layer 138 outside a footprint of conductive pillars 144 is removed by an etching process. Semiconductor wafer 120 is singulated through saw street 126 using a saw blade or laser cutting tool 153 into individual semiconductor die 124. FIG. 3r shows a top view of the singulated semiconductor die 124 with conductive material 152 disposed within conductive ring 150 over top surface 145 of conductive pillars 144.

FIG. 4a shows a base substrate or PCB 154 with an electrically conductive layer 156 formed over surface 157 of the base substrate using PVD, CVD, electrolytic plating, electroless plating process, or other suitable metal deposition process. Conductive layer 156 can be one or more layers of Al, Cu, Sn, Ni, Au, Ag, or other suitable electrically conductive material. Conductive layer 156 operates as contact pads or conductive traces for later mounted semiconductor die 124.

Figure 4C:
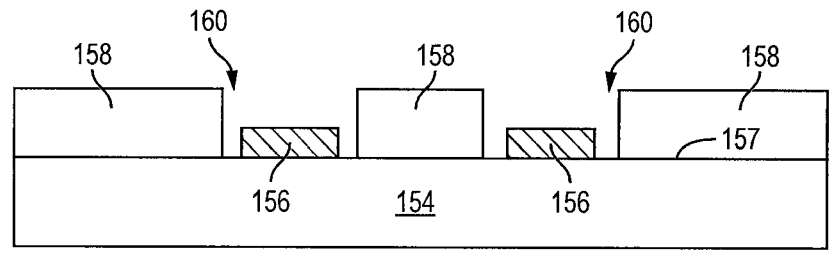

In FIG. 4b, a solder resist or insulating layer 158 is formed over surface 157 of substrate 154 and conductive layer 156 using PVD, CVD, printing, spin coating, spray coating, sintering or thermal oxidation. The insulating layer 158 can contain one or more layers of $SiO_2$, $Si_3N_4$, SiON, $Ta_2O_5$, $Al_2O_3$, or photo-sensitive material. In one embodiment, insulating layer 158 has a thickness of 10-30 μm. The insulating layer 158 covers surface 157 of substrate 154, sidewall of conductive layer 156, and top surface of conductive layer 156. A top surface of insulating layer 158 is substantially flat. A portion of insulating layer 158 is removed by patterning, exposure to UV light, and developing to form circular openings 160 and expose conductive layer 156, as shown in FIG. 4c. In another example, the solder resist can include a DFR material with a PET support film. The DFR is laminated, undergoes an edge rinse, is aligned over conductive layer 156, the PET support film is removed, and the DFR material is then developed. The DFR can be irradiated using a visible light laser to form a desired pattern. The irradiated DFR material is then subjected to a developer which selectively dissolves non-irradiated portions of the photoresist material and leaves the irradiated portions of the photoresist material intact. In one embodiment, the size of openings 160 can be in the range of 40-60 μm or 80-100 μm.

Figure 4D:
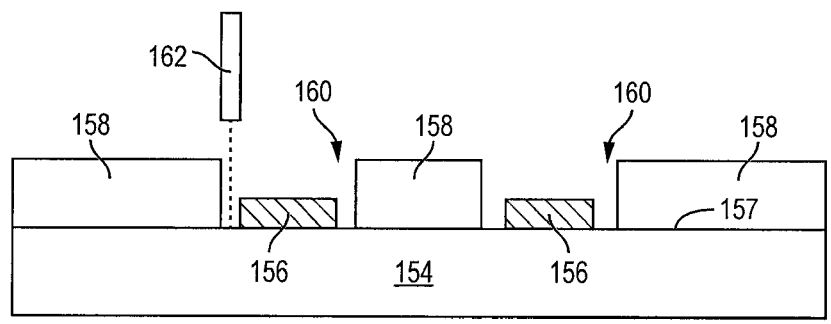

Alternatively, circular openings 160 can be formed by LDA using laser 162 to expose conductive layer 156 in applications requiring finer interconnect dimensions, as shown in FIG. 4d.

Figure 4E:
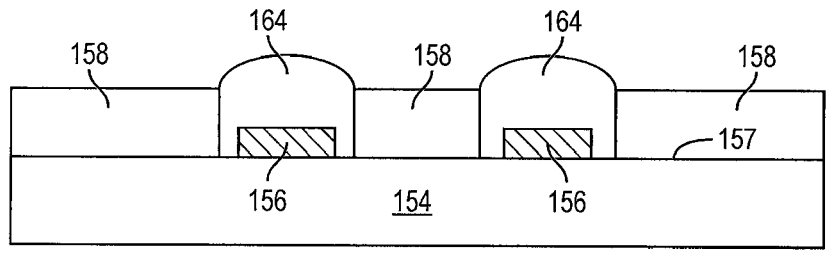

In FIG. 4e, an electrically conductive bump material is deposited over conductive layer 156 within openings 160 in solder on pad (SOP) configuration using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 156 using a suitable attachment or bonding process. In one embodiment, the bump material is reflowed by heating the material above its melting point to form bumps 164. In some applications, bumps 164 are reflowed a second time to improve electrical contact to conductive layer 156. Bumps 164 can also be compression bonded to conductive layer 156. Bumps 164 represent one type of interconnect structure that can be formed over conductive layer 156. The interconnect structure can also use stud bump, micro bump, or other electrical interconnect.

Figure 5A:
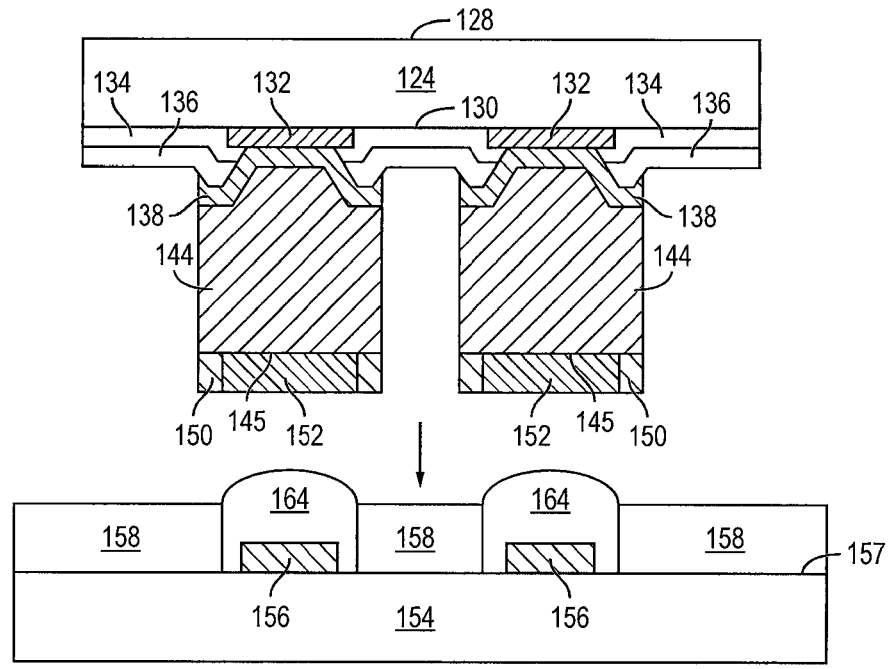
FIGS. 5a-5b illustrate a semiconductor die bonded to a substrate with the conductive material recessed with the surface of the conductive pillar.
Figure 5B:
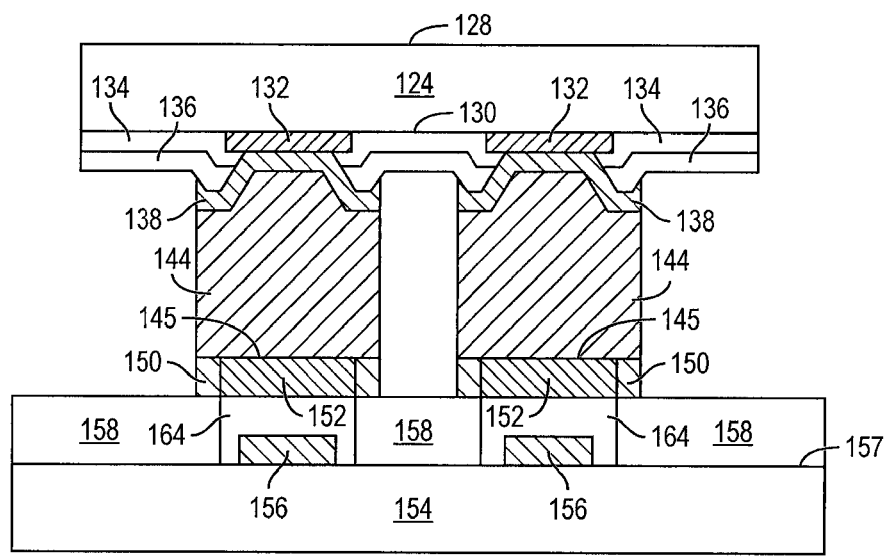

In FIG. 5a, semiconductor die 124 from FIGS. 3a-3r is oriented over and mounted to substrate 154 using a pick and place operation with conductive pillars 144 electrically connected to conductive layer 156. FIG. 5b shows semiconductor die 124 mounted to substrate 154 with conductive rings 150 contacting insulating layer 158 and conductive pillars 144 electrically connected to conductive layer 156. More specifically, SOP bumps 164 are reflowed to bond with conductive material 152 within conductive ring 150. Conductive ring 150 inhibits the flow of conductive material between adjacent conductive pillars 144 and prevents electrical bridging defects during the reflow process. That is, conductive ring 150 over conductive pillars 144 encloses and contains conductive material 152 and bumps 164 to block the outward flow of conductive material from under conductive pillars 144 caused by excess conductive material volume and pressure during reflow. Since conductive material 152 and bumps 164 do not flow beyond a footprint of conductive pillars 144 during reflow, the electrical bridging defects found in the prior art can be avoided. Conductive pillars 144 with conductive material 152 formed within conductive ring 150 enables a fine pitch electrical interconnect because conductive material 152 and bump material do not extend beyond the footprint of conductive pillars 144 during reflow.

Figure 6A:
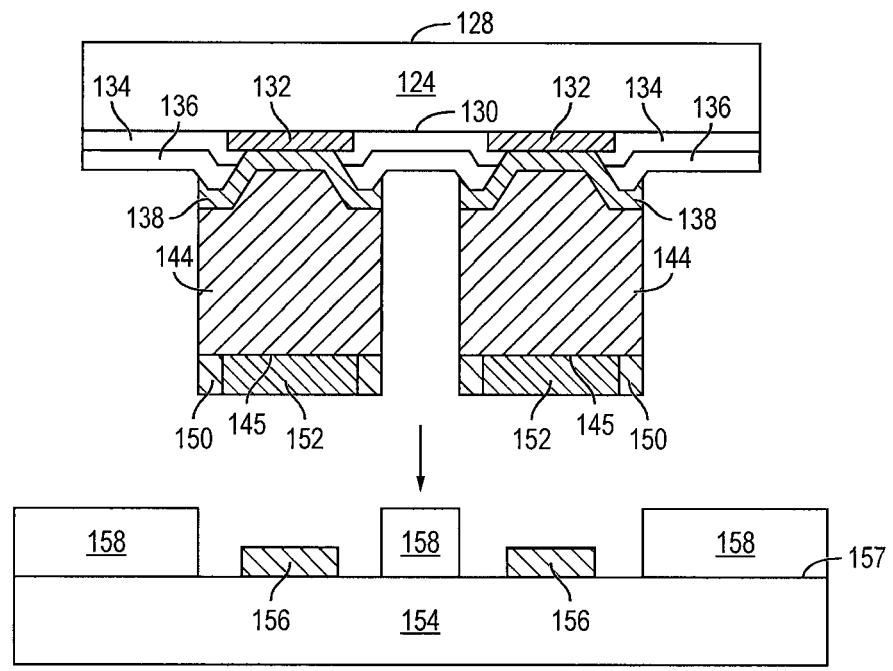
FIGS. 6a-6b illustrate another semiconductor die bonded to a substrate with the conductive material recessed with the surface of the conductive pillar.
Figure 6B:
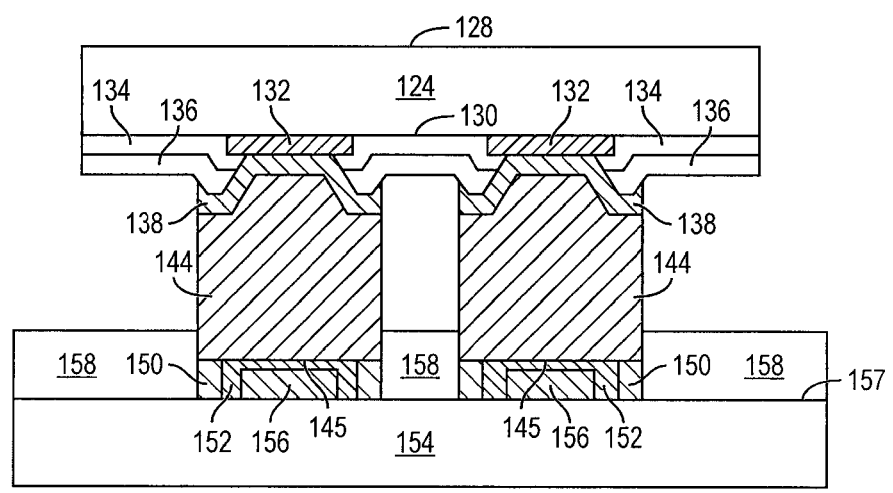

FIGS. 6a and 6b show semiconductor die 124 from FIGS. 3a-3r is oriented over and mounted to the substrate arrangement from FIGS. 4c-4d, i.e., without bumps 164, using a pick and place operation with conductive pillars 144 electrically connected to conductive layer 156. FIG. 6b shows semiconductor die 124 mounted to substrate 154 with conductive rings 150 contacting substrate 154 and conductive pillars 144 electrically connected to conductive layer 156. More specifically, conductive material 152 is reflowed to bond with conductive layer 156. Conductive ring 150 inhibits the flow of conductive material 152 between adjacent conductive pillars 144 and prevents electrical bridging defects during the reflow process. That is, conductive ring 150 over conductive pillars 144 encloses and contains conductive material 152 to block the outward flow of conductive material from under conductive pillars 144 caused by excess conductive material volume and pressure during reflow. Since conductive material 152 does not flow beyond a footprint of conductive pillars 144 during reflow, the electrical bridging defects found in the prior art can be avoided. Conductive pillars 144 with conductive material 152 formed within conductive ring 150 enables a fine pitch electrical interconnect because conductive material 152 does not extend beyond the footprint of conductive pillars 144 during reflow.

While one or more embodiments of the present invention have been illustrated in detail, the skilled artisan will appreciate that modifications and adaptations to those embodiments may be made without departing from the scope of the present invention as set forth in the following claims.

What is claimed:

1. A method of making a semiconductor device, comprising:
   providing a semiconductor die including a first conductive layer formed over a surface of the semiconductor die;
   forming a first insulating layer over the surface of the semiconductor die and first conductive layer;
   conformally applying a second conductive layer over the first insulating layer and first conductive layer;
   forming a second insulating layer over the second conductive layer;
   forming a plurality of conductive pillars within the second insulating layer;
   forming a third insulating layer over the second insulating layer and conductive pillars;
   removing a ring-shaped portion of the third insulating layer around a perimeter of the conductive pillars;
   forming a plurality of conductive rings within the removed ring-shaped portion of the third insulating layer over and around the perimeter of the conductive pillars;
   removing a circular portion of the third insulating layer over the conductive pillars within the conductive rings;
   depositing a conductive material over the conductive pillars within the conductive rings; and
   removing remaining portions of the second and third insulating layers.

2. The method of claim 1, further including:
   providing a substrate;
   forming a third conductive layer over a surface of the substrate;
   forming a fourth insulating layer over the surface of the substrate and third conductive layer;
   forming a plurality of bumps over the third conductive layer; and
   disposing the semiconductor die over the substrate with the bumps bonded to the conductive material over the conductive pillars within the conductive rings.

3. The method of claim 2, wherein the conductive rings inhibit outward flow of the conductive material and bumps from under the conductive pillars.

4. The method of claim 2, further including disposing the semiconductor die over the substrate by reflowing the bumps and conductive material.

5. The method of claim 2, further including disposing the semiconductor die over the substrate so that the conductive rings contact the fourth insulating layer or the substrate.

6. The method of claim 1, further including utilizing laser direct ablation to remove a portion of the second insulating layer in order to form the conductive pillars.

7. The method of claim 1, further including:
   providing a substrate;
   forming a third conductive layer over a surface of the substrate;
   forming a fourth insulating layer over the surface of the substrate and third conductive layer; and
   disposing the semiconductor die over the substrate with the third conductive layer bonded to the conductive material.

8. A method of making a semiconductor device, comprising:
   providing a semiconductor die;
   forming a first conductive layer over a surface of the semiconductor die;
   forming a conductive pillar over the first conductive layer;
   forming a first insulating layer over a surface of the conductive pillar;
   forming a ring-shaped opening in the first insulating layer around a perimeter of the conductive pillar;
   forming a second conductive layer in the ring-shaped opening in the first insulating layer;
   removing the first insulating layer over the surface of the conductive pillar; and
   forming a first conductive material to fill an area over the surface of the conductive pillar within a height of the second conductive layer with the first conductive material terminating within a footprint of the conductive pillar providing a substrate;
   forming a third conductive layer over a surface of the substrate;
   forming a second insulating layer over the surface of the substrate and third conductive layer;
   forming a plurality of bumps over the third conductive layer; and
   disposing the semiconductor die over the substrate with the bumps bonded to the first conductive material.

9. The method of claim 8, further including disposing the semiconductor die over the substrate so that the second conductive layer contacts the second insulating layer or the substrate.

10. The method of claim 8, wherein the second conductive layer reduces outward flow of the first conductive material from under the conductive pillars.

11. The method of claim 8, further including disposing the semiconductor die over the substrate by reflowing the first conductive material.

12. The method of claim 8, wherein forming the conductive pillar includes:
   forming a third insulating layer over the surface of the semiconductor die;
   forming an opening in the third insulating layer; and
   depositing a second conductive material in the opening of the third insulating layer to form the conductive pillar.

13. A method of making a semiconductor device, comprising:
   providing a semiconductor die;
   forming a conductive pillar over the semiconductor die;
   depositing a first conductive layer over a perimeter of a surface of the conductive pillar; and
   forming a first conductive material to fill an area over the surface of the conductive pillar within a height of the first conductive layer providing a substrate;
   forming a second conductive layer over a surface of the substrate;
   forming a first insulating layer over the surface of the substrate and second conductive layer;
   forming a plurality of bumps over the second conductive layer; and
   disposing the semiconductor die over the substrate with the bumps bonded to the first conductive material.

14. The method of claim 13, further including disposing the semiconductor die over the substrate so that the first conductive layer contacts the first insulating layer or the substrate.

15. The method of claim 13, wherein the first conductive layer reduces outward flow of the first conductive material.

16. The method of claim 13, wherein forming the conductive pillar includes:
   forming a second insulating layer over the semiconductor die;
   forming an opening in the second insulating layer; and
   depositing a second conductive material in the opening of the second insulating layer to form the conductive pillar.

17. The method of claim 16, wherein forming the first conductive layer includes:

forming a third insulating layer over the first insulating layer and conductive pillar;

forming an opening in the third insulating layer around the perimeter of the surface of the conductive pillar; and depositing a third conductive material in the opening of the third insulating layer to form the first conductive layer.

* * * * *